US008276103B2

(12) United States Patent
Iyanagi

(10) Patent No.: US 8,276,103 B2
(45) Date of Patent: Sep. 25, 2012

(54) PHOTOMASK DESIGNING METHOD, PHOTOMASK MANUFACTURING METHOD, AND PHOTOMASK DESIGNING PROGRAM

(75) Inventor: Katsumi Iyanagi, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 99 days.

(21) Appl. No.: 12/883,299

(22) Filed: Sep. 16, 2010

(65) Prior Publication Data
US 2011/0070531 A1 Mar. 24, 2011

(30) Foreign Application Priority Data
Sep. 21, 2009 (JP) ................................. 2009-218226

(51) Int. Cl.
*G06F 17/50* (2006.01)
(52) U.S. Cl. ............... 716/51; 716/52; 716/53; 716/54; 716/55; 716/56
(58) Field of Classification Search .................. 716/50, 716/51, 53, 54, 55, 56, 52; 430/5
See application file for complete search history.

(56) References Cited

U.S. PATENT DOCUMENTS

| 7,716,617 B2 * | 5/2010 | Mashita et al. ............... 716/119 |
| 7,805,699 B2 * | 9/2010 | Kusnadi et al. .................. 716/51 |
| 7,939,222 B2 * | 5/2011 | Chen et al. .......................... 430/5 |
| 7,966,585 B2 * | 6/2011 | Park ................................ 716/54 |
| 2010/0193960 A1 * | 8/2010 | Mashita et al. ............... 257/773 |

FOREIGN PATENT DOCUMENTS

| JP | 2001-230323 A | 8/2001 |
| JP | 2002-198435 A | 7/2002 |
| JP | 2004-165675 A | 6/2004 |
| JP | 2004-333529 A | 11/2004 |
| JP | 2008-276184 A | 11/2008 |
| JP | 2010-016044 A | 1/2010 |

OTHER PUBLICATIONS

Japanese Office action for 2009-218226 dated Aug. 11, 2011.
Taguchi, et al., U.S. Appl. No. 12/705,640, filed Feb. 15, 2010.
Mashita, et al., U.S. Appl. No. 12/688,644, filed Jan. 15, 2010.

* cited by examiner

*Primary Examiner* — Sun Lin
(74) *Attorney, Agent, or Firm* — Pearne & Gordon LLP

(57) ABSTRACT

In one embodiment, a photomask designing method is disclosed. The method includes dividing design pattern data into predetermined regions and obtaining a pattern perimeter for each of the divided regions. The method includes obtaining the pattern perimeter for an entire region of the design pattern data by repeating the obtaining the pattern perimeter for the each of the divided regions. The method includes obtaining a dimension conversion difference for the entire region of the design pattern data using the pattern perimeter for the entire region of the design pattern data and a correlation obtained in advance between a predicted pattern perimeter and a predicted dimension conversion difference. The method includes performing process proximity correction on the design pattern data using a value of the obtained dimension conversion difference, and creating exposure pattern data from the corrected design pattern data.

20 Claims, 5 Drawing Sheets

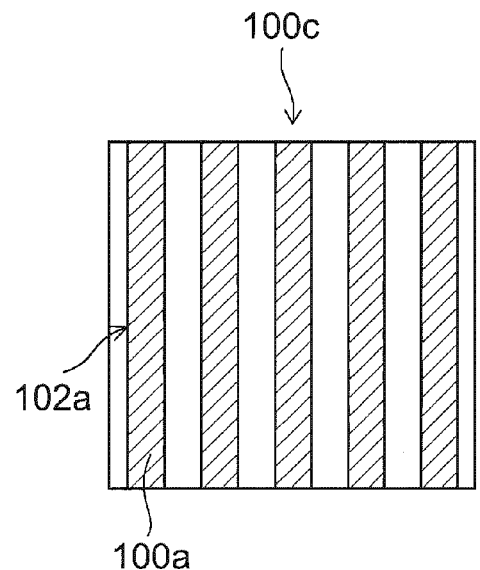
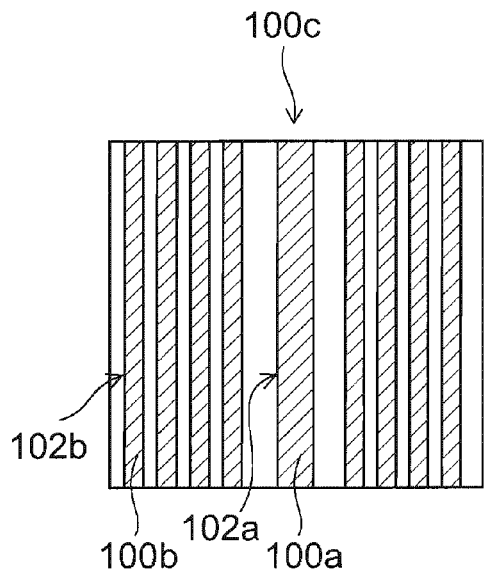
FIG. 1A  FIG. 1B
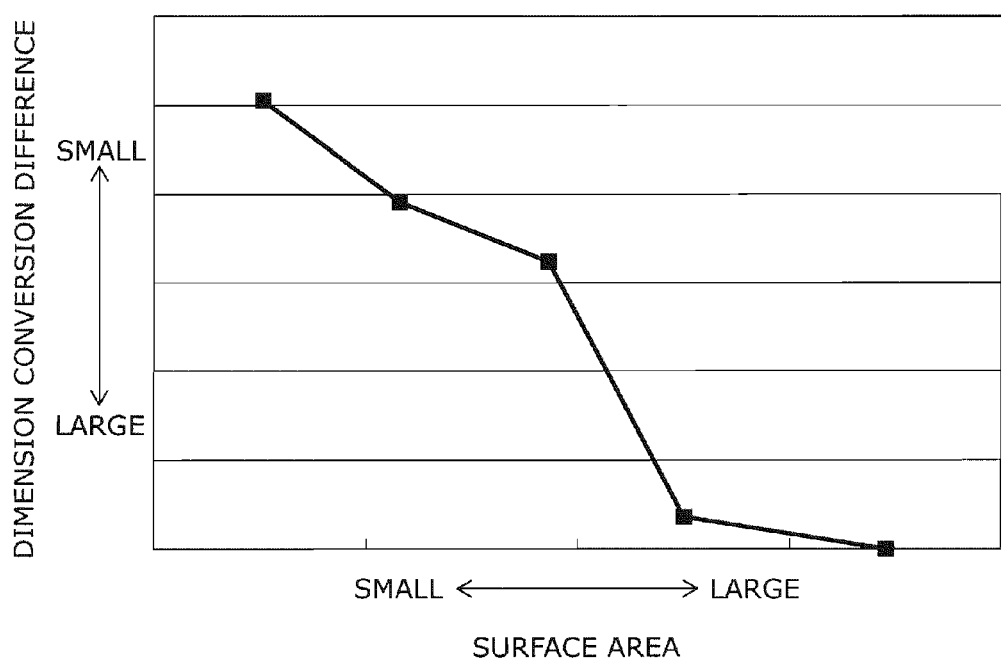
FIG. 2

PHOTOMASK DESIGNING METHOD, PHOTOMASK MANUFACTURING METHOD, AND PHOTOMASK DESIGNING PROGRAM

CROSS-REFERENCE TO RELATED APPLICATIONS

This application is based upon and claims the benefit of priority from the prior Japanese Patent Application No. 2009-218226, filed on Sep. 21, 2009; the entire contents of which are incorporated herein by reference.

FIELD

Embodiments described herein relate generally to a photomask designing method, a photomask manufacturing method, and a photomask designing program.

BACKGROUND

In recent years, remarkably fine patterns are used for semiconductor devices and the like. With finer design rules, it is becoming increasingly difficult to transfer a design pattern accurately on a substrate (for example, a wafer). When transferring a design pattern onto a wafer, for example, if the pattern transferred on the wafer greatly differs from the design pattern, the following problems may be caused. Specifically, the electric properties are deteriorated, bridging, breakage, and the like occur in the pattern, and the yield is reduced.

Thus, process proximity correction (PPC) or the like is performed to correct the shape of a mask pattern so that the shape and dimension of a design pattern can be transferred accurately.

Meanwhile, it is known that a so-called micro-loading effect in an etching process increases the variation of formed pattern dimensions.

For this reason, a photomask manufacturing method has been proposed to perform process proximity correction in consideration of the micro-loading effect (refer to JP-A 2004-333529 (Kokai)).

In the technique disclosed in JP-A 2004-333529 (Kokai), first, the pattern area ratio (coverage) of a region including a pattern to be corrected is computed. Then, the design pattern is corrected on the basis of predetermined process proximity correction data for each pattern area ratio (coverage) and the computed pattern area ratio (coverage).

However, in the technique disclosed in JP-A 2004-333529 (Kokai), the density of a pattern is not taken into account. For this reason, when predetermined process proximity correction data is used, an error may occur in dimension conversion difference prediction depending on the density of the pattern. Additionally, such an error in dimension conversion difference prediction may be further increased in the recent trend of finer pattern fabrication.

BRIEF SUMMARY OF THE INVENTION

In general, according to one embodiment, a photomask designing method is disclosed. The method includes dividing design pattern data into predetermined regions and obtaining a pattern perimeter for each of the divided regions. The method includes obtaining the pattern perimeter for an entire region of the design pattern data by repeating the obtaining the pattern perimeter for the each of the divided regions. The method includes obtaining a dimension conversion difference for the entire region of the design pattern data using the pattern perimeter for the entire region of the design pattern data and a correlation obtained in advance between a predicted pattern perimeter and a predicted dimension conversion difference. The method includes performing process proximity correction on the design pattern data using a value of the obtained dimension conversion difference. In addition, the method includes creating exposure pattern data from the corrected design pattern data.

According to another embodiment, a photomask manufacturing method is disclosed. The method includes creating exposure pattern data by adopting the above photomask designing method and manufacturing a photomask on the basis of the created exposure pattern data.

According to another embodiment, a photomask designing program causes a computer to execute dividing design pattern data into predetermined regions and computing a pattern perimeter for each of the divided regions. The program causes the computer to execute computing the pattern perimeter for an entire region of the design pattern data by repeating the computing the pattern perimeter for the each of the divided regions. The program causes the computer to execute computing a dimension conversion difference for the entire region of the design pattern data using the pattern perimeter for the entire region of the design pattern data and a correlation obtained in advance between a predicted pattern perimeter and a predicted dimension conversion difference. The program causes the computer to execute performing process proximity correction on the design pattern data using a value of the obtained dimension conversion difference, and creating exposure pattern data from the corrected design pattern data.

BRIEF DESCRIPTION OF THE DRAWINGS

FIGS. 1A and 1B are schematic plan views for exemplifying the case where a dimension conversion difference occurs even for the same "pattern area ratio (coverage)";

FIG. 2 is a schematic view for exemplifying the relationship between a dimension conversion difference and the surface area of side surfaces of a pattern;

DETAILED DESCRIPTION

Figure 3A:
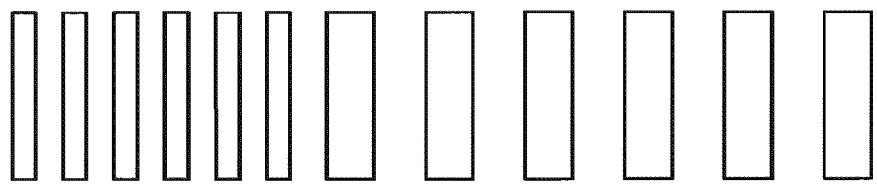
FIGS. 3A to 3C are schematic views for exemplifying a method for segmenting a pattern into a dense pattern region and a sparse pattern region.

In general, according to one embodiment, a photomask designing method is disclosed. The method includes dividing design pattern data into predetermined regions and obtaining a pattern perimeter for each of the divided regions. The method includes obtaining the pattern perimeter for an entire region of the design pattern data by repeating the obtaining the pattern perimeter for the each of the divided regions. The method includes obtaining a dimension conversion difference for the entire region of the design pattern data using the pattern perimeter for the entire region of the design pattern data and a correlation obtained in advance between a predicted pattern perimeter and a predicted dimension conversion difference. The method includes performing process proximity correction on the design pattern data using a value of the obtained dimension conversion difference. In addition, the method includes creating exposure pattern data from the corrected design pattern data.

According to another embodiment, a photomask manufacturing method is disclosed. The method includes creating exposure pattern data by adopting the above photomask designing method and manufacturing a photomask on the basis of the created exposure pattern data.

According to another embodiment, a photomask designing program causes a computer to execute dividing design pattern data into predetermined regions and computing a pattern perimeter for each of the divided regions. The program causes the computer to execute computing the pattern perimeter for an entire region of the design pattern data by repeating the computing the pattern perimeter for the each of the divided regions. The program causes the computer to execute computing a dimension conversion difference for the entire region of the design pattern data using the pattern perimeter for the entire region of the design pattern data and a correlation obtained in advance between a predicted pattern perimeter and a predicted dimension conversion difference. The program causes the computer to execute performing process proximity correction on the design pattern data using a value of the obtained dimension conversion difference, and creating exposure pattern data from the corrected design pattern data.

Embodiments will be exemplified below with reference to the drawings.

In order to transfer the dimension and shape of a design pattern accurately, it is necessary to correct the shape of a pattern on a photomask (reticle) used in a lithography process by predicting the dimension conversion difference in advance (dimension conversion difference prediction). To this end, if the accuracy of dimension conversion difference prediction is improved, a desired pattern can be formed accurately.

In this respect, if an analysis index for matters influencing the accuracy of dimension conversion difference prediction is specified and the correlation between the analysis index and the dimension conversion difference is obtained, the accuracy of dimension conversion difference prediction can be improved significantly.

For this reason, first, illustration will be given concerning a knowledge obtained by the inventor about the analysis index for matters influencing the accuracy of dimension conversion difference prediction.

An example of the analysis index for matters influencing the accuracy of dimension conversion difference prediction includes a "pattern area ratio (coverage)." The "pattern area ratio (coverage)" is an area occupied by a pattern per unit area.

Here, if the "pattern area ratio (coverage)" is changed, an incident amount of an incident object (for example, radicals, ions, or the like) is changed, and the dimension conversion difference is changed accordingly.

Hence, the dimension conversion difference is predictable by obtaining the correlation between the "pattern area ratio (coverage)" and the dimension conversion difference in advance through experiments, simulations, or the like. Specifically, the area occupied by a pattern per unit area is obtained for design pattern data. Then, the dimension conversion difference can be predicted by using and the correlation obtained in advance between the "pattern area ratio (coverage)" and the dimension conversion difference.

However, according to the knowledge obtained by the inventor, there is a case where a dimension conversion difference varies even for the same "pattern area ratio (coverage)."

FIGS. 1A and 1B are schematic plan views for exemplifying the case where a dimension conversion difference occurs even for the same "pattern area ratio (coverage)."

FIG. 2 is a schematic view for exemplifying the relationship between a dimension conversion difference and the surface area of side surfaces of a pattern. In the case shown in FIG. 1A, the "pattern area ratio (coverage)" of a pattern 100a is 50%. Meanwhile, in the case shown in FIG. 1B also, the "pattern area ratio (coverage)" of a pattern 100b is 50%.

However, if the pattern 100a and the pattern 100b have the same height dimension (i.e., a dimension in a direction substantially perpendicular to the illustrated plane), the total surface area of side surfaces 102b of the pattern 100b is larger than the total surface area of the side surface 102a of the pattern 100a. Here, an incident amount of an incident object (for example, radicals, ions, or the like) is increased as the surface area of the side surfaces is increased. Accordingly, as shown in FIG. 2, the value of the dimension conversion difference increases along with enlargement in the surface area even for an identical pattern shape 100c.

In other words, dimension conversion difference varies even for the same "pattern area ratio (coverage)." Accordingly, an error occurs in dimension conversion difference prediction if the dimension conversion difference is obtained on the basis of the "pattern area ratio (coverage)." Additionally, an error in dimension conversion difference prediction may be further increased in the recent trend of finer pattern fabrication.

Thus, in this embodiment, a "pattern perimeter" is used as the analysis index in consideration of the difference in surface area of pattern side surfaces.

In this case, the "pattern perimeter" can be defined as an outer peripheral length of a pattern occupying per unit area in a plane.

If the "pattern perimeter" is elongated, the surface area of side surfaces of a pattern is increased, so that an incident amount of an incident object (for example, radicals, ions, or the like) is also increased as described above. The dimension conversion difference is increased accordingly.

Hence, the dimension conversion difference is predictable by obtaining the correlation between the "pattern perimeter" and the dimension conversion difference in advance through experiments, simulations, or the like. Specifically, the outer peripheral length ("pattern perimeter") of a pattern occupying per unit area in a plane is obtained for design pattern data. Then, the dimension conversion difference can be predicted by using the correlation obtained in advance between the "pattern perimeter" and the dimension conversion difference.

In this manner, the difference in surface area of side surfaces of a pattern can be reflected in dimension conversion difference prediction. Hence, the accuracy of dimension conversion difference prediction can be improved.

When performing a film formation process or the like, the dimension conversion difference can be predicted using only the "pattern perimeter," since the influence of the "pattern area ratio (coverage)" is small. Meanwhile, when performing an etching process or the like, the dimension conversion difference is predicted preferably using not only the "pattern perimeter" but also the "pattern area ratio (coverage)," since the influence of the "pattern area ratio (coverage)" is large. Note that the dimension conversion difference can be predicted using both the "pattern perimeter" and the "pattern area ratio (coverage)" even when the process is film formation or the like.

When predicting dimension conversion difference by use of the "pattern perimeter" and the "pattern area ratio (coverage)," either the "pattern perimeter" or the "pattern area ratio (coverage)" can be used depending on the density of a pattern. Alternatively, the "pattern perimeter" and the "pattern area ratio (coverage)" can be used in combination.

For example, in a region where a pattern is sparse (hereinafter referred to as a sparse pattern region), the dimension conversion difference can be predicted using the "pattern area ratio (coverage)," since the influence of the "pattern perimeter" is small. Meanwhile, in a region where a pattern is dense (hereinafter referred to as a dense pattern region) or for a fine pattern, the dimension conversion difference can be predicted using the "pattern perimeter," since the influence of the "pattern perimeter" is large. In this case, the accuracy of dimension conversion difference prediction can be further improved by using the "pattern perimeter" and the "pattern area ratio (coverage)" in combination.

Here, when either the "pattern perimeter" or the "pattern area ratio (coverage)" is used depending on the density of a pattern, a design pattern needs to be segmented into a dense pattern region and a sparse pattern region.

Figure 3B:
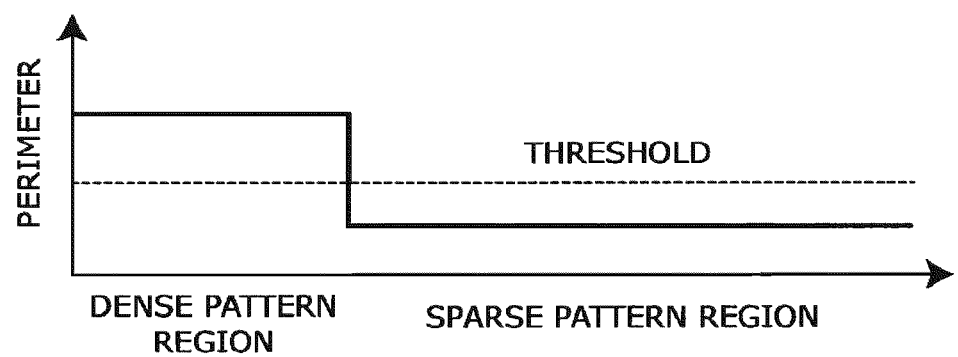
Figure 3C:
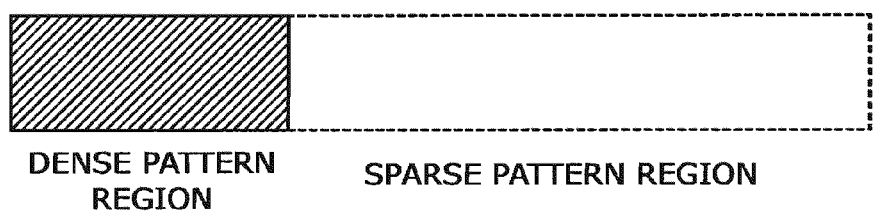

FIGS. 3A to 3C are schematic views for exemplifying a method for segmenting a pattern into a dense pattern region and a sparse pattern region.

When segmenting a pattern into a dense pattern region and a sparse pattern region, first, design pattern data is divided into predetermined regions (for example, into fine regions), and patterns respectively included in the divided regions are extracted as shown in FIG. 3A.

Next, as shown in FIG. 3B, the "pattern perimeters" of the extracted patterns are obtained. Then, the obtained "pattern perimeters" are sorted, using a predetermined threshold, into a dense pattern region (part having a long "pattern perimeter") and a sparse pattern region (part having a short "pattern perimeter"). Next, as shown in FIG. 3C, the dense pattern region is extracted. Incidentally, the sparse pattern region may be extracted instead.

Then, by repeating the aforementioned procedures, the entire design pattern data is segmented into dense pattern regions and sparse pattern regions.

FIGS. 4A to 4D are schematic views for exemplifying another method for segmenting a design pattern data into a dense pattern region and a sparse pattern region.

Figure 4A:
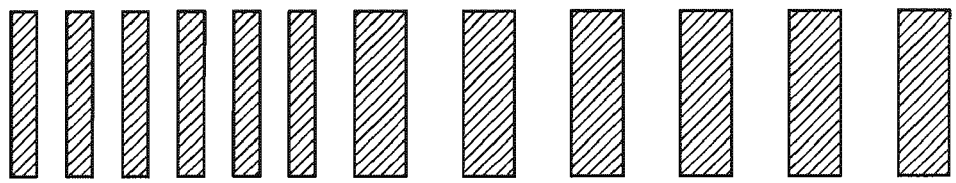
FIGS. 4A to 4E are schematic views for exemplifying another method for segmenting a design pattern data into a dense pattern region and a sparse pattern region.

First, design pattern data is divided into predetermined regions (for example, into fine regions), and patterns respectively included in the divided regions are extracted as shown in FIG. 4A.

Figure 4B:
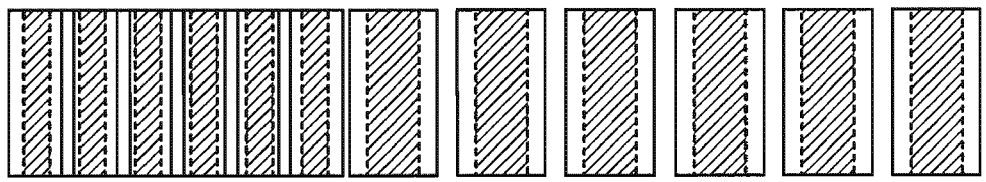

Next, as shown in FIG. 4B, each of the patterns is expanded in a width direction thereof. Here, the patterns are expanded to the extent that two adjacent patterns are brought into contact with each other in a part where a space between the two is narrow.

Figure 4C:
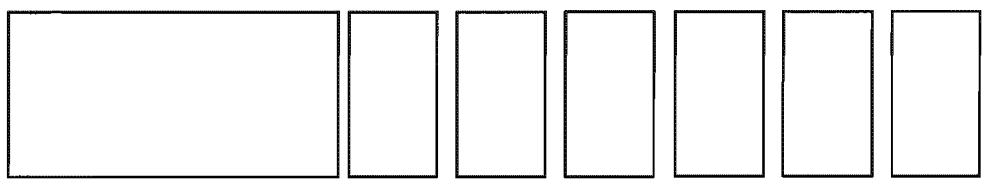

Next, as shown in FIG. 4C, a so-called merging process is performed. At this point, in the part where the patterns are brought into contact with each other, the patterns are overlapped with each other and integrated.

Figure 4D:
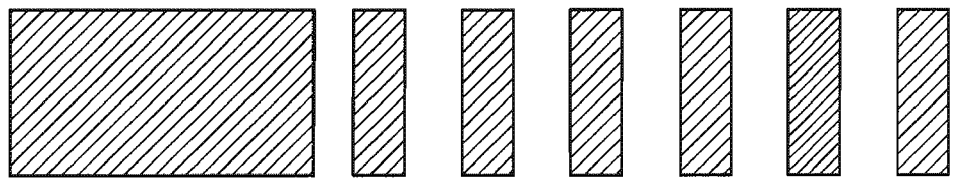

Next, as shown in FIG. 4D, the patterns subjected to the merging process are shrunk in the width direction. In this process, the patterns are shrunk to the same extent as expanded in FIG. 4B.

Figure 4E:
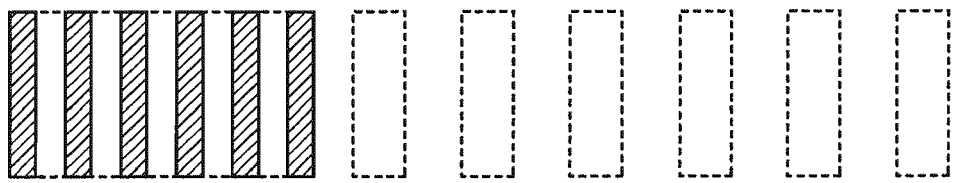

Next, exclusive disjunction (XOR) is performed on the patterns in FIG. 4A and FIG. 4D, and thereby the design pattern data is segmented into dense and sparse pattern regions as shown in FIG. 4E.

As another analysis index for matters influencing the accuracy of dimension conversion difference prediction, a "diffusivity index" can be exemplified.

For example, in an etching process, a substance removed by an incident object (for example, radicals, ions, or the like) is released diffusely into a processing space. Similarly in a film formation process, an incident object reaches the processing surface diffusely. For this reason, the dimension conversion difference is also changed according to the diffusivity.

In this respect, since a process such as pattern formation is generally performed under a reduced pressure environment of approximately several Pa in many cases, the diffusivity can be analyzed by considering the gas flow. In this case, when it is difficult to derive the diffusion equation, a Monte Carlo method or the like can be used to obtain an approximate solution.

Then, the dimension conversion difference is predictable by obtaining the correlation between the gas flow (diffusivity) and the dimension conversion difference in advance through experiments, simulations, or the like. For example, the gas flow (diffusivity) is analyzed on the basis of design pattern data (for example, density of a pattern, and the like) and processing data (for example, processing pressure and the like). Then, the dimension conversion difference can be predicted by using the correlation obtained in advance between the gas flow (diffusivity) and the dimension conversion difference. To put it differently, the "diffusivity index" is an analysis index that is related to the correlation between the dimension conversion difference and the gas flow which is analyzed on the basis of data extracted from design pattern data and processing data.

In this case, the dimension conversion difference can be predicted by combining the "diffusivity index (related to the correlation between the dimension conversion difference and the gas flow)" serving as an analysis index with the "pattern perimeter" and the "pattern area ratio (coverage)," which are described above. In other words, the dimension conversion difference can be predicted in consideration of the gas flow (diffusivity).

Figure 5A:
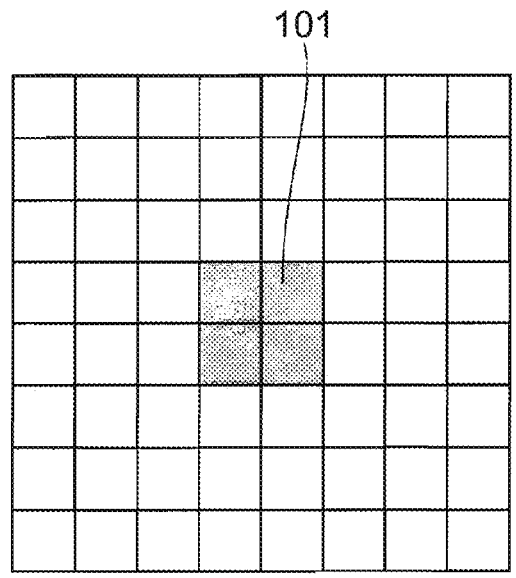
FIGS. 5A to 5C are schematic views for exemplifying a case where the dimension conversion difference is predicted in consideration of the gas flow (diffusivity)
Figure 5B:
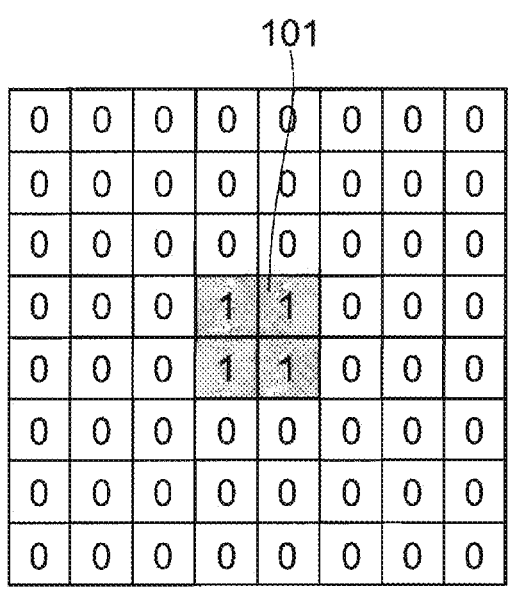
Figure 5C:
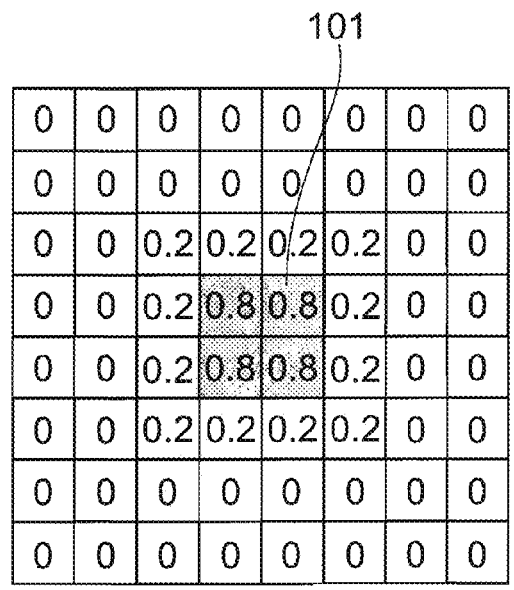

FIGS. 5A to 5C are schematic views for exemplifying a case where the dimension conversion difference is predicted in consideration of the gas flow (diffusivity). FIG. 5A is a schematic view for exemplifying the shape of a portion to be processed (for example, a portion where removal is performed by an etching process). FIG. 5B is a schematic view for exemplifying a case where there is no gas flow (diffusivity). FIG. 5C is a schematic view for exemplifying a case where the gas flow (diffusivity) is taken into consideration.

As shown in FIG. 5A, the vicinity of a portion 101 to be processed is partitioned in a lattice form, and the gas flow (diffusivity) in each partition is obtained through a simulation or the like.

When there is no gas flow (diffusivity), a process (for example, removal by an etching process) is performed only on the portion 101 to be processed as shown in FIG. 5B. Here, the degree of processing is represented by "1" for comparison with the case of considering the gas flow (diffusivity).

Meanwhile, when the gas flow (diffusivity) is taken into consideration, a process (for example, removal by an etching process) is performed on and also around the portion 101 to be processed as shown in FIG. 5C. Here, the degree of processing on the portion 101 to be processed is lower than that in the case shown in FIG. 5B where there is no gas flow (diffusivity). In addition, the farther away from the portion 101 to be processed, the lower the degree of processing becomes. Note that, in the case shown in FIG. 5C, as an example, the degree of processing on the portion 101 to be processed is set to "0.8", whereas the degree of processing around the portion 101 to be processed is set to "0.2."

When the degree of processing is high, the dimension change is increased, so that the dimension conversion difference is increased accordingly. Thus, the dimension conversion difference can be predicted by combining the analysis indexes on the basis of the following relationships. Specifically, the prediction is made on the basis of the relationship between the size and shape of the portion 101 to be processed and the degree of processing as exemplified in FIG. 5C, namely, the relationship between the "pattern perimeter" and the "pattern area ratio (coverage)," and the "diffusivity index (related to the correlation between the dimension conversion difference and the gas flow)."

Moreover, the gas flow (diffusivity) is influenced by the density of a pattern. Generally, the gas flow (diffusivity) is likely to occur in a sparse pattern region, while the gas flow (diffusivity) is likely to stagnate in a dense pattern region or on a fine pattern.

Moreover, as described above, either the "pattern perimeter" or the "pattern area ratio (coverage)" can be used depending on the density of a pattern. Alternatively, the "pattern perimeter" and the "pattern area ratio (coverage)" can be used in combination.

Thus, the "diffusivity index (related to the correlation between the dimension conversion difference and the gas flow)" is combined with the "pattern perimeter" and the "pattern area ratio (coverage)" depending on the density of a pattern, and the correlation of the dimension conversion difference with each analysis index can be obtained through experiments, simulation, or the like.

As has been exemplified above, a more accurate and comprehensive analysis index is obtained by combining the "diffusivity index (related to the correlation between the dimension conversion difference and the gas flow)" with the "pattern perimeter" and the "pattern area ratio (coverage)." Furthermore, by using such an analysis index, the accuracy of dimension conversion difference prediction can be further improved.

In a photomask designing method according to this embodiment, a dimension conversion difference is obtained on the basis of the analysis index exemplified above, and the value of the obtained dimension conversion difference is used to correct a pattern shape of a photomask for a lithography process.

Hereinafter, the photomask designing method according to this embodiment will be exemplified.

Figure 6:
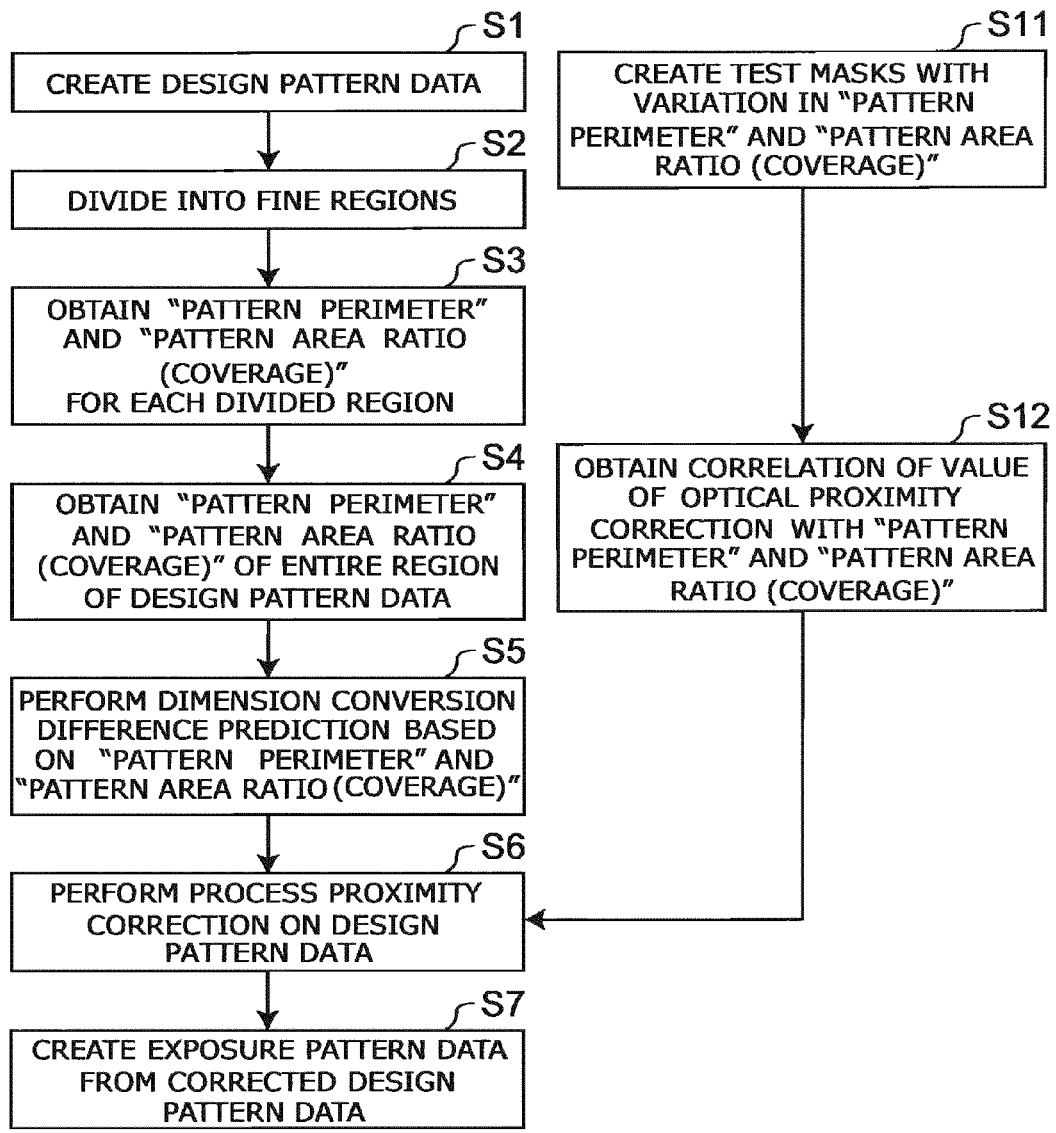
FIG. 6 is a flowchart for exemplifying the photomask designing method according to this embodiment.

FIG. 6 is a flowchart for exemplifying the photomask designing method according to this embodiment.

First, design pattern data (data on a pattern formed on a substrate (for example, a wafer)) is created (Step S1).

Next, the design pattern data is divided into predetermined regions (for example, fine regions) (Step S2).

Next, the "pattern perimeter" and the "pattern area ratio (coverage)" of each of the divided regions are obtained (Step S3).

For example, a pattern included in a divided region is extracted, and the "pattern perimeter" and the "pattern area ratio (coverage)" are obtained on the basis of the extracted pattern.

Next, by repeating the aforementioned procedures, the "pattern perimeter" and the "pattern area ratio (coverage)" of an entire region of the design pattern data are obtained (Step S4).

Next, a dimension conversion difference is obtained (dimension conversion difference prediction is performed) on the basis of the "pattern perimeter" and the "pattern area ratio (coverage)" (Step S5).

For example, the dimension conversion difference of the entire design pattern data is obtained from the "pattern perimeter" and the "pattern area ratio (coverage)" of the entire design pattern data and a correlation obtained in advance of a dimension conversion difference with a "pattern perimeter" and a "pattern area ratio."

In this case, when the "pattern perimeter" and the "pattern area ratio (coverage)" are used as the analysis index, the dimension conversion difference is obtained from the "pattern perimeter" and the "pattern area ratio (coverage)" obtained in Step S4 and the correlation obtained in advance of the dimension conversion difference with the "pattern perimeter" and the "pattern area ratio (coverage)."

Moreover, when the dimension conversion difference is predicted using the "pattern perimeter" and the "pattern area ratio (coverage)," either the "pattern perimeter" or the "pattern area ratio (coverage)" can be used depending on the density of a pattern. Alternatively, the "pattern perimeter" and the "pattern area ratio (coverage)" can be used in combination.

Moreover, the dimension conversion difference can be obtained by combining the "diffusivity index (related to the correlation between the dimension conversion difference and the gas flow)" with the "pattern perimeter" and the "pattern area ratio (coverage)." Specifically, in the procedure of obtaining the dimension conversion difference, a correlation between the dimension conversion difference and the gas flow can be taken into consideration, the gas flow analyzed on the basis of data extracted from the design pattern data and processing data.

Next, the value of the obtained dimension conversion difference is used to perform process proximity correction on the design pattern data (Step S6).

Next, exposure pattern data is created from the corrected design pattern data (Step S7).

Additionally, it is also possible to further include a procedure of searching the corrected design pattern data for a portion not satisfying a design rule.

Then, when the corrected design pattern data has a portion not satisfying the design rule (for example, a danger point or the like), the design pattern data is modified. The dimension conversion difference of the modified data is obtained, and the value of the dimension conversion difference thus obtained is used to perform process proximity correction again.

Additionally, in the procedure of performing process proximity correction, optical proximity correction can be performed simultaneously.

When the optical proximity correction is performed simultaneously, first, test masks with variation in "pattern perimeter" and "pattern area ratio (coverage)" are created (Step S11).

For example, a dot pattern or the like is formed to cover a region of a predetermined size, and an opening is formed to manufacture a test mask having a desired "pattern perimeter" and "pattern area ratio (coverage)."

Next, pattern transfer is performed using the test mask. The correlation of a value of the optical proximity correction with a "pattern perimeter" and a "pattern area ratio (coverage)" is obtained on the basis of a measurement value of a dimension of the transferred pattern (Step S12).

The obtained correlation of the value of the optical proximity correction with the "pattern perimeter" and the "pattern area ratio (coverage)" is used when the optical proximity correction is simultaneously performed in Step S5. Note that optical proximity correction can be performed by adopting a known technique, and description thereof is omitted.

A photomask is designed in the aforementioned manner.

Note that the creation of design pattern data is not absolutely necessary, and design pattern data already created can be used instead.

Moreover, in the above exemplification, dimension conversion difference prediction is performed on the basis of the "pattern perimeter" and the "pattern area ratio (coverage)." However, dimension conversion difference prediction can be performed on the basis of only the "pattern perimeter." Nevertheless, the prediction accuracy can be improved when dimension conversion difference prediction is performed on the basis of both the "pattern perimeter" and the "pattern area ratio (coverage)."

In the photomask designing method according to this embodiment, the dimension conversion difference is obtained on the basis of the "pattern perimeter" and the "pattern area ratio (coverage)." This enables an improvement in the accuracy of dimension conversion difference prediction. Thus, process proximity correction is performed accurately.

Moreover, by using either the "pattern perimeter" or the "pattern area ratio (coverage)" depending on the density of a pattern, or by using the "pattern perimeter" and the "pattern area ratio (coverage)" in combination, the accuracy of dimension conversion difference prediction is further improved.

Moreover, when the "diffusivity index (related to the correlation between the dimension conversion difference and the gas flow)" is combined with "pattern perimeter" and the "pattern area ratio (coverage)" as appropriate to obtain the dimension conversion difference, the accuracy of dimension conversion difference prediction is further improved.

Moreover, a portion not satisfying a design rule (for example, a danger point or the like) is also accurately extracted. This enables an improvement in the accuracy of searching the design pattern data.

Next, a photomask manufacturing method according to this embodiment will be exemplified.

In the photomask manufacturing method according to this embodiment, exposure pattern data is created from design pattern data by the above-described photomask designing method. On the basis of the created exposure pattern data, a photomask is manufactured. In this case, the photomask can be manufactured by adopting an etching process.

By the photomask manufacturing method according to this embodiment, a dimension conversion difference is obtained on the basis of the "pattern perimeter," the "pattern area ratio (coverage)," and the like. This enables an improvement in the accuracy of dimension conversion difference prediction. Thus, process proximity correction is accurately performed, and a photomask with fewer dimension conversion differences is obtained. Additionally, extraction of a portion not satisfying a design rule (for example, a danger point or the like), and the like are accurately performed. As a result, a photomask excellent in the product yield is obtained.

Next, a method for fabricating an electronic component according to this embodiment will be exemplified.

Note that the description is given by taking a method for fabricating a semiconductor device as an example of the method for fabricating an electronic component.

The method for fabricating a semiconductor device involves repetition of multiple processes such as: formation of a pattern on a wafer by film formation, resist application, exposure, development, etching, resist removal, and the like; inspection; cleaning; thermal treatment; doping; diffusion; and planarization. In such a method for fabricating a semiconductor device, a photomask is manufactured by the above-described photomask manufacturing method, and the exposure is performed using the manufactured photomask.

Incidentally, the processes other than the above-described photomask manufacturing method can be performed by adopting a known technique, and description thereof is omitted.

The method for fabricating a semiconductor device has been described as an example of the method for fabricating an electronic component according to this embodiment. However, the method for fabricating an electric component is not limited thereto. The method can be widely applied to fabrication of an electronic component adopting a photolithography process such as pattern formation in manufacturing a flat panel display (for example, pattern formation for a liquid crystal color filter, array substrate, and the like).

In the method for fabricating an electronic component according to this embodiment, a photomask with fewer dimension conversion differences is used to form a pattern. Additionally, a photomask in which extraction of a portion not satisfying a design rule (for example, a danger point or the like), and the like are accurately performed is used to form a pattern. This suppresses deterioration of the electric properties due to deformation of the pattern as well as bridging, breakage, and the like in the pattern. Thus, the yield, quality, and the like of the product can be improved.

Next, a photomask designing program according to this embodiment will be exemplified.

The photomask designing program according to this embodiment causes a computer to compute design pattern data, compute a dimension conversion difference on the basis of at least the "pattern perimeter," perform process proximity correction on the design pattern data using a value of the computed dimension conversion difference, and compute exposure pattern data from the corrected design pattern data. Moreover, the program is also capable of causing a computer to perform optical proximity correction simultaneously in performing process proximity correction. Furthermore, the dimension conversion difference can be obtained by combining the "pattern perimeter" with the "pattern area ratio (coverage)" and "diffusivity index (related to the correlation between the dimension conversion difference and the gas flow)" as appropriate.

In order to execute the photomask designing program, the photomask designing program according to this embodiment is stored in an unillustrated storage unit provided in a computer. In this case, while stored in, for example, an unillustrated recording medium, the photomask designing program can be supplied to the computer, read out from the recording medium, and then stored in the unillustrated storage unit provided in the computer. Alternatively, the program can be stored in the unillustrated storage unit provided in the computer through a communications line or the like connected to the computer.

The photomask designing program stored in the unillustrated storage unit provided in the computer is capable of executing, for example, the following formula procedures (1) to (7).

(1) A procedure of computing design pattern data on the basis of an input from an unillustrated database or an input by an operator.

(2) A procedure of dividing the design pattern data into predetermined regions (for example, into fine regions).

(3) A procedure of computing a "pattern perimeter" and a "pattern area ratio (coverage)" of each of the divided regions.

(4) A procedure of computing a "pattern perimeter" and a "pattern area ratio (coverage)" of the entire design pattern data by repeating the aforementioned procedures.

(5) A procedure of computing a dimension conversion difference on the basis of the "pattern perimeter" and the "pattern area ratio (coverage)."

(6) A procedure of performing process proximity correction on the design pattern data using a value of the computed dimension conversion difference.

(7) A procedure of creating exposure pattern data from the corrected design pattern data.

Note that in the procedure (6), optical proximity correction can be performed simultaneously in performing the process proximity correction.

Moreover, the procedure of computing the design pattern data is not absolutely necessary. Design pattern data already computed can be provided or extracted instead.

Furthermore, the photomask designing program according to this embodiment may be executed by a single computation unit, or executed by multiple computation units part by part.

Additionally, it is also possible to include a procedure of searching the corrected design pattern data for a portion not satisfying a design rule.

Then, when the corrected design pattern data has a portion satisfying no design rule (for example, a danger point or the like), the operator can be informed of the result. The design pattern data is modified in terms of the portion not satisfying a design rule. The dimension conversion difference of the modified data is computed. The value of the dimension conversion difference thus computed is used to perform process proximity correction again.

Note that the "pattern perimeter," the "pattern area ratio (coverage)," and the "diffusivity index (related to the correlation between the dimension conversion difference and the gas flow)" as well as acquisition of the dimension conversion difference on the basis of such analysis indexes, and so forth are the same as those described above, and descriptions thereof are omitted.

By the photomask designing program according to this embodiment, the dimension conversion difference is obtained on the basis of the "pattern perimeter" and the "pattern area ratio (coverage)." This enables an improvement in the accuracy of dimension conversion difference prediction. Thus, process proximity correction is performed accurately.

Moreover, by using either the "pattern perimeter" or the "pattern area ratio (coverage)" depending on the density of a pattern, or by using the "pattern perimeter" and the "pattern area ratio (coverage)" in combination, the accuracy of dimension conversion difference prediction is further improved.

Moreover, when the "diffusivity index (related to the correlation between the dimension conversion difference and the gas flow)" is combined with the "pattern perimeter" and the "pattern area ratio (coverage)" as appropriate to compute the dimension conversion difference, the accuracy of dimension conversion difference prediction is further improved.

Moreover, a portion not satisfying a design rule (for example, a danger point or the like) is also accurately extracted. This enables an improvement in the accuracy of searching the design pattern data.

The embodiments have been exemplified. However, the invention is not limited to these descriptions.

Even when the designs of the above-described embodiments are modified by those skilled in the art as appropriate, it is understood that such modifications are within the scope of the invention, as long as the characteristics of the invention are included therein.

While certain embodiments have been described, these embodiments have been presented by way of example only, and are not intended to limit the scope of the inventions. Indeed, the novel methods and programs described herein may be embodied in a variety of other forms; furthermore, various omissions, substitutions and changes in the form of the methods and programs described herein may be made without departing from the spirit of the inventions. The accompanying claims and their equivalents are intended to cover such forms or modifications as would fall within the scope and spirit of the invention.

For example, a case of etching has been exemplified, but the same holds true for a case where a film is formed on a processing portion.

Moreover, each component in the above-described embodiments can be combined with the others in all the possible manners, and these possible combinations are within the scope of the invention, as long as the characteristics of the invention are included therein.

The invention claimed is:

1. A photomask designing method comprising:
dividing design pattern data of a photomask into predetermined regions by a machine;
obtaining a pattern perimeter for each of the divided regions by a machine;
obtaining a pattern perimeter for an entire region of the design pattern data by repeating the obtaining a pattern perimeter for the each of the divided regions by a machine;
obtaining a dimension conversion difference for the entire region of the design pattern data using the pattern perimeter for the entire region of the design pattern data and a correlation, which is obtained in advance, between a predicted pattern perimeter and a predicted dimension conversion difference by a machine;
performing a process proximity correction on the design pattern data using a value of the obtained dimension conversion difference by a machine; and
creating exposure pattern data from the design pattern data corrected by the process proximity correction by a machine.

2. The method according to claim 1, wherein
the obtaining a pattern perimeter for each of the divided regions further includes obtaining a pattern area ratio for each of the divided regions,
the obtaining a pattern perimeter for the entire region of the design pattern data further includes obtaining a pattern area ratio for the entire region of the design pattern data, and
the obtaining a dimension conversion difference includes obtaining the dimension conversion difference for the entire region of the design pattern data using the pattern perimeter for the entire region of the design pattern data and the pattern area ratio for the entire region of the design pattern data and a correlation, which is obtained in advance, between the predicted dimension conversion difference and the predicted pattern perimeter and a predicted pattern area ratio.

3. The method according to claim 1, wherein
the obtaining a pattern perimeter for each of the divided regions further includes obtaining a pattern area ratio for each of the divided regions,
the obtaining a pattern perimeter for the entire region of the design pattern data further includes obtaining a pattern area ratio for the entire region of the design pattern data, and
the obtaining a dimension conversion difference includes selecting at least any one of the pattern perimeter for the entire region of the design pattern data and the pattern area ratio for the entire region of the design pattern data depending on a density of a pattern.

4. The method according to claim 3, wherein the obtaining a dimension conversion difference includes selecting a pattern area ratio for a sparse pattern region, and selecting a pattern perimeter for any one of a dense pattern region and a fine pattern.

5. The method according to claim 3, wherein the obtaining a dimension conversion difference includes selecting a pattern perimeter of a photomask when the photomask is used for a film formation process, and selecting the pattern perimeter and a pattern area ratio of the photomask when the photomask is used for an etching process.

6. The method according to claim 1, wherein the obtaining a dimension conversion difference includes considering a correlation between the predicted dimension conversion difference and a gas flow analyzed based on processing data and data extracted from the design pattern data.

7. The method according to claim 1, further comprising searching the corrected design pattern data for a portion not satisfying a design rule.

8. The method according to claim 7, wherein the searching for a portion not satisfying the design rule includes modifying the design pattern data, when the portion not satisfying the design rule is detected.

9. The method according to claim 1, wherein the performing a process proximity correction includes performing optical proximity correction simultaneously.

10. The method according to claim 9, wherein the optical proximity correction is performed based on a correlation, which is obtained in advance, between a value of the optical proximity correction and at least any one of the predicted pattern perimeter and a predicted pattern area ratio.

11. A photomask manufacturing method comprising:
creating exposure pattern data by adopting a photomask designing method by a computer and/or a processor; and
manufacturing a photomask based on the created exposure pattern data by a machine,
the photomask designing method including:
dividing design pattern data of a photomask into predetermined regions;
obtaining a pattern perimeter for each of the divided regions;
obtaining a pattern perimeter for an entire region of the design pattern data by repeating the obtaining a pattern perimeter for the each of the divided regions;
obtaining a dimension conversion difference for the entire region of the design pattern data using the pattern perimeter for the entire region of the design pattern data and a correlation, which is obtained in advance, between a predicted pattern perimeter and a predicted dimension conversion difference;
performing a process proximity correction on the design pattern data using a value of the obtained dimension conversion difference; and
creating exposure pattern data from the design pattern data corrected by the process proximity correction.

12. A photomask designing program causing a computer to execute:
dividing design pattern data of a photomask into predetermined regions;
computing a pattern perimeter for each of the divided regions;
computing a pattern perimeter for an entire region of the design pattern data by repeating the computing a pattern perimeter for the each of the divided regions;
computing a dimension conversion difference for the entire region of the design pattern data using the pattern perimeter for the entire region of the design pattern data and a correlation, which is obtained in advance, between a predicted pattern perimeter and a predicted dimension conversion difference;
performing a process proximity correction on the design pattern data using a value of the obtained dimension conversion difference; and
creating exposure pattern data from the design pattern data corrected by the process proximity correction.

13. The program according to claim 12, wherein
the computing a pattern perimeter for each of the divided regions further includes obtaining a pattern area ratio for each of the divided regions,
the computing a pattern perimeter for the entire region of the design pattern data further includes obtaining a pattern area ratio for the entire region of the design pattern data, and
the computing a dimension conversion difference includes obtaining the dimension conversion difference for the entire region of the design pattern data using the pattern perimeter for the entire region of the design pattern data and the pattern area ratio for the entire region of the design pattern data and a correlation, which is obtained in advance, between the predicted dimension conversion difference and the predicted pattern perimeter and a predicted pattern area ratio.

14. The program according to claim 12, wherein
the computing a pattern perimeter for each of the divided regions further includes obtaining a pattern area ratio for each of the divided regions,
the computing a pattern perimeter for the entire region of the design pattern data further includes obtaining a pattern area ratio for the entire region of the design pattern data, and
the computing a dimension conversion difference includes selecting at least any one of the pattern perimeter for the entire region of the design pattern data and the pattern area ratio for the entire region of the design pattern data depending on a density of a pattern.

15. The program according to claim 14, wherein
the computing a dimension conversion difference includes selecting a pattern area ratio for a sparse pattern region, and
selecting a pattern perimeter for any one of a dense pattern region and a fine pattern.

16. The program according to claim 14, wherein
the computing a dimension conversion difference includes selecting a pattern perimeter of a photomask when the photomask is used for a film formation process, and
selecting the pattern perimeter and a pattern area ratio of the photomask when the photomask is used for an etching process.

17. The program according to claim 12, wherein
the computing a dimension conversion difference includes considering a correlation between the predicted dimension conversion difference and a gas flow analyzed based on processing data and data extracted from the design pattern data.

18. The program according to claim 12, further comprising searching the corrected design pattern data for a portion not satisfying a design rule.

19. The program according to claim 12, wherein
the performing a process proximity correction includes performing optical proximity correction simultaneously.

20. The program according to claim 19, wherein
the optical proximity correction is performed based on a correlation, which is obtained in advance, between a value of the optical proximity correction and at least any one of the predicted pattern perimeter and a predicted pattern area ratio.

* * * * *